(12) United States Patent
Tao et al.

(10) Patent No.: US 12,174,254 B2
(45) Date of Patent: Dec. 24, 2024

(54) FAULT DETECTION METHOD AND RELATED APPARATUS

(71) Applicant: Huawei Technologies Co., Ltd., Shenzhen (CN)

(72) Inventors: Zhe Tao, Shanghai (CN); Ge Shen, Shenzhen (CN); Jianlong Cao, Shanghai (CN); Ming Wang, Shenzhen (CN); Rui Fang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/308,405

(22) Filed: Apr. 27, 2023

(65) Prior Publication Data

US 2023/0258718 A1 Aug. 17, 2023

Related U.S. Application Data

(63) Continuation of application No. PCT/CN2021/126873, filed on Oct. 28, 2021.

(30) Foreign Application Priority Data

Oct. 29, 2020 (CN) .......................... 202011180288.7

(51) Int. Cl.
*G01R 31/3185* (2006.01)
*G06F 9/48* (2006.01)

(52) U.S. Cl.
CPC ... *G01R 31/318544* (2013.01); *G06F 9/4881* (2013.01)

(58) Field of Classification Search
CPC ........... G01R 31/318544; G06F 9/4881; G06F 9/544; G06F 11/2205; G06F 11/263; G06F 11/0706; G06F 9/5038; G06F 9/505; G06F 11/3688
USPC ........................................................ 714/726
See application file for complete search history.

(56) References Cited

U.S. PATENT DOCUMENTS

| | | | |
|---|---|---|---|
| 5,953,530 A | 9/1999 | Rishi et al. | |
| 6,715,062 B1 | 3/2004 | Moore | |
| 2008/0307276 A1* | 12/2008 | Bodrozic | G01R 31/31716 714/E11.002 |
| 2009/0024894 A1* | 1/2009 | Arora | G06F 11/263 714/739 |

(Continued)

FOREIGN PATENT DOCUMENTS

| | | |
|---|---|---|
| CN | 1204499 C | 6/2005 |
| CN | 103430155 A | 12/2013 |

(Continued)

OTHER PUBLICATIONS

Emre Ozer et al., Error Correlation Prediction in Lockstep Processors for Safety-Critical Systems, Dec. 13, 2018, 12 pages.

*Primary Examiner* — James C Kerveros
(74) *Attorney, Agent, or Firm* — Conley Rose, P.C.

(57) ABSTRACT

A fault detection method includes: obtaining a scheduling table of a target task, where the scheduling table is used to indicate at least one test pattern, the at least one test pattern is used to detect a fault in a target logic circuit, and the target logic circuit is a logic circuit configured to execute the target task; and executing the at least one test pattern based on the scheduling table, to detect the fault in the target logic circuit.

20 Claims, 9 Drawing Sheets

(56) References Cited

U.S. PATENT DOCUMENTS

| | | | |
|---|---|---|---|
| 2009/0113261 A1* | 4/2009 | Kajihara | G01R 31/318328 |
| | | | 714/724 |
| 2013/0290795 A1 | 10/2013 | Rajski et al. | |
| 2014/0046615 A1 | 2/2014 | Demay | |
| 2014/0351664 A1* | 11/2014 | Akdemir | G01R 31/31701 |
| | | | 714/724 |
| 2017/0228279 A1 | 8/2017 | Mariani et al. | |
| 2018/0239665 A1 | 8/2018 | Hutton et al. | |
| 2019/0019594 A1 | 1/2019 | Ishii et al. | |
| 2019/0195947 A1 | 6/2019 | Sarangi et al. | |
| 2020/0116783 A1 | 4/2020 | Kalva et al. | |

FOREIGN PATENT DOCUMENTS

| | | |
|---|---|---|
| CN | 103744775 A | 4/2014 |
| CN | 107003912 A | 8/2017 |
| CN | 108491288 A | 9/2018 |
| CN | 109376090 A | 2/2019 |
| CN | 109490753 A | 3/2019 |
| WO | 2020081524 A1 | 4/2020 |

\* cited by examiner

200

201
Obtain a scheduling table of a target task, where the scheduling table is used to indicate at least one test pattern, the at least one test pattern is used to detect a fault in a target logic circuit, and the target logic circuit is a logic circuit configured to execute the target task 202
Execute the at least one test pattern based on the scheduling table, to detect the fault in the target logic circuit

FIG. 2

STL: Software test library

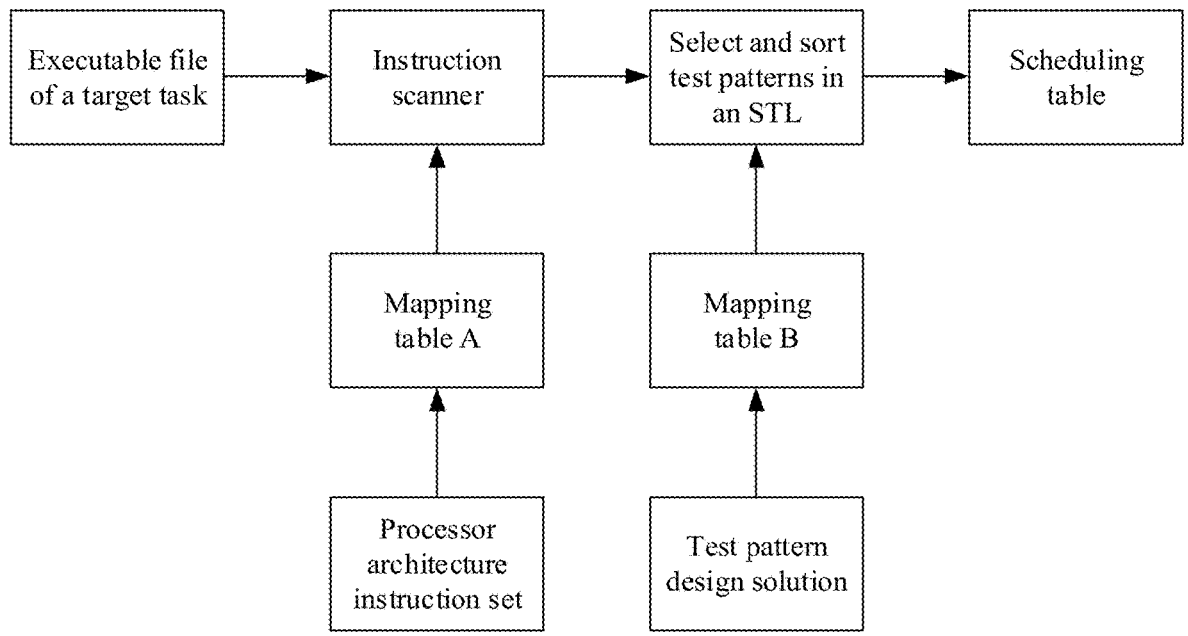
FIG. 3C
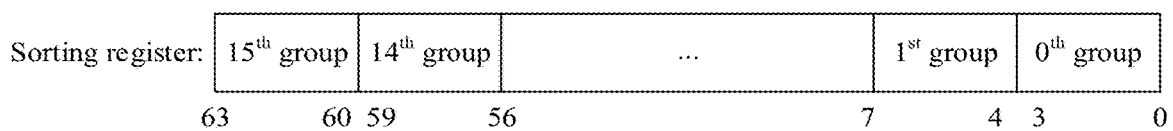
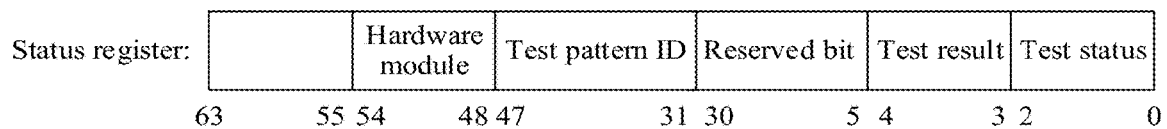
FIG. 4

FAULT DETECTION METHOD AND RELATED APPARATUS

CROSS-REFERENCE TO RELATED APPLICATIONS

This is a continuation of Int'l Patent App. No. PCT/CN2021/126873, filed on Oct. 28, 2021, which claims priority to Chinese Patent App. No. 202011180288.7, filed on Oct. 29, 2020, both of which are incorporated by reference.

FIELD

This disclosure relates to the field of computer technologies, furthermore, to a fault detection method and a related apparatus.

BACKGROUND

In the computer field, a random hardware fault may occur in a data processing apparatus, such as a permanent fault caused by a short circuit or an open circuit in an integrated circuit, or a temporary fault such as bit flipping caused by exposure to natural radiation or particle collision.

In some application fields with high security requirements, for example, in the automotive field in which security is critical, to ensure functional safety, a fault detection mechanism may be provided for a processor, to detect a hardware fault and ensure that a secure operation is performed when the hardware fault occurs.

Currently, in a related technology, a processor periodically executes test patterns in a software test library (STL), to detect a fault in a logic circuit. However, because the STL includes a large quantity of test patterns, when the processor periodically executes the test patterns in the STL, load of the processor is heavy. In other words, the processor needs to spend a long time in fault detection. This affects working efficiency of the processor.

SUMMARY

This disclosure provides a fault detection method and a related apparatus. In a process of performing fault detection, a scheduling table of a target task is determined, to execute a test pattern included in the scheduling table. Because the scheduling table includes only the test pattern used to detect a target logic circuit, and the target logic circuit is configured to execute the target task, detecting a fault based on the scheduling table can avoid executing all test patterns in a software test library. This reduces load of a processor and effectively improves working efficiency of the processor.

According to a first aspect, a fault detection method is provided, and the method is applied to a terminal in a field with a security requirement, for example, a vehicle-mounted terminal or a control terminal in aerospace. The method includes: The terminal obtains a scheduling table of a target task, where the scheduling table may be preset in the terminal or generated in advance by the terminal, the target task may be, for example, a process or a thread, the scheduling table includes at least one test pattern, and based on the at least one test pattern, a fault in a target logic circuit on which execution of the target task depends can be detected; and finally, the terminal executes the at least one test pattern based on the scheduling table, to implement fault detection of the target logic circuit.

In this solution, in a process of performing fault detection, the terminal determines the scheduling table of the target task, to execute a test pattern included in the scheduling table. Because the scheduling table includes only the test pattern used to detect the target logic circuit, and the target logic circuit is configured to execute the target task, detecting a fault based on the scheduling table can avoid executing all test patterns in a software test library. This reduces load of a processor and effectively improves working efficiency of the processor.

In some possible implementations, the target task is a running task. In a process in which the terminal runs the target task, if a fault occurs in a logic circuit that needs to be used in a process of running the target task, a security risk may be generated due to the fault in the logic circuit when the terminal runs the target task. Therefore, the test pattern is executed based on the scheduling table of the target task, so that fault detection of the logic circuit that needs to be used can be implemented, and a security risk is avoided. For another logic circuit, because the terminal does not execute a corresponding task currently, that is, the another logic circuit does not need to be used, even if a fault occurs in this logic circuit, no security risk is generated. In this way, fault detection is performed based on a scheduling table of a currently running task, so that only a test pattern in the scheduling table of the single task can be detected each time fault detection is performed, and execution of all the test patterns in the software test library is avoided. This reduces the load of the processor and effectively improves the working efficiency of the processor. In some possible implementations, before performing fault detection, the terminal may generate in advance a scheduling table corresponding to a to-be-run task. In some embodiments, the method may further include: The terminal obtains a machine instruction code set of the target task. Because the target task may be a process or a thread, for example, a corresponding machine instruction code set may be obtained based on an executable file of the target task. The machine instruction code set includes a plurality of machine instruction codes (also referred to as machine codes). The terminal determines, based on a preset second mapping relationship, at least one instruction type corresponding to the machine instruction code set, where the second mapping relationship includes a mapping relationship between a machine instruction code and an instruction type, and in the mapping relationship, one machine instruction code uniquely corresponds to one instruction type. The terminal determines, based on a preset first mapping relationship, the at least one test pattern corresponding to the at least one instruction type, where the at least one test pattern is used to detect a fault in a logic circuit corresponding to the at least one instruction type, the first mapping relationship includes a mapping relationship between an instruction type and a test pattern, and in the mapping relationship, one instruction type may correspond to one or more test patterns. Then, the terminal generates the scheduling table based on the at least one test pattern.

In other words, after obtaining the machine instruction code set of the target task, the terminal determines, based on the preset second mapping relationship, an instruction type corresponding to the machine instruction code set, and determines, based on the first mapping relationship, a test pattern corresponding to the instruction type, to obtain a test pattern corresponding to the target task.

In this solution, the terminal may generate, based on the preset mapping relationships, the scheduling table corresponding to the to-be-run task, to ensure that the terminal can generate a scheduling table corresponding to a new task when obtaining the new task. This ensures implementability of the solution.

In some possible implementations, the method may further include: The terminal determines a quantity of execution times of an instruction type in the at least one instruction type based on instruction types respectively corresponding to the plurality of machine instruction codes. Simply speaking, the terminal may count a quantity of machine instruction codes corresponding to each instruction type, and determine the quantity of machine instruction codes corresponding to the instruction type as a quantity of execution times of the instruction type. The terminal may determine an execution sequence of a test pattern in the at least one test pattern based on the quantity of execution times, to generate the scheduling table that further includes the execution sequence of the test pattern. That is, the terminal may sort test patterns in descending order based on a quantity of execution times. A larger quantity of execution times of an instruction type corresponding to a test pattern indicates a higher execution sequence of the test pattern. On the contrary, a smaller quantity of execution times of the instruction type corresponding to the test pattern indicates a lower execution sequence of the test pattern.

Because a fault may occur in the logic circuit each time the logic circuit is used, when a probability of a fault occurring in the logic circuit is the same, a larger quantity of times of using the logic circuit indicates a higher probability of a fault occurring in the logic circuit. In other words, a larger quantity of execution times of a same instruction type and a larger quantity of times of using a logic circuit indicate a higher probability of a fault occurring in the logic circuit. Therefore, in this embodiment, the execution sequence of the test pattern in the scheduling table is determined based on the quantity of execution times of the instruction type corresponding to the machine instruction code of the target task, so that the terminal can determine, based on a probability of a fault occurring in a logic circuit, a sequence of detecting the logic circuit, that is, first detect a logic circuit with a higher probability of a fault. This shortens fault detection time and improves fault detection efficiency.

In this solution, the terminal determines an execution sequence of a test pattern based on a quantity of execution times of an instruction type corresponding to a task in a process of generating a scheduling table corresponding to the task, so that the fault detection time can be shortened, and the fault detection efficiency can be improved.

In some possible implementations, the scheduling table may be preset in the terminal or generated in advance by the terminal. The at least one test pattern in the scheduling table is determined based on a first mapping relationship and at least one instruction type, the first mapping relationship includes a mapping relationship between an instruction type and a test pattern, the at least one instruction type is determined based on a second mapping relationship and a machine instruction code set of the target task, the second mapping relationship includes a mapping relationship between a machine instruction code and an instruction type, and the machine instruction code set includes a plurality of machine instruction codes.

In some possible implementations, the scheduling table further indicates an execution sequence of the at least one test pattern, and the execution sequence is determined based on a quantity of execution times of the at least one instruction type corresponding to the machine instruction code set of the target task.

In some possible implementations, when there is a large quantity of to-be-run tasks in the terminal, the terminal may generate a large quantity of scheduling tables. Therefore, the method may further include: The terminal generates a third mapping relationship. The third mapping relationship includes a mapping relationship between the target task and the scheduling table. In this way, when performing fault detection, the terminal may determine the scheduling table based on the target task and the third mapping relationship. This ensures that the terminal can quickly determine the scheduling table corresponding to the target task in the process of performing fault detection, and improves the fault detection efficiency.

In some possible implementations, the scheduling table is stored in a shared memory, the shared memory is configured to store a scheduling table of one or more tasks, and the shared memory is accessible to a plurality of processors. When the terminal provides the configuration area for the scheduling table by reserving the shared memory, the plurality of processors in the terminal may all access the scheduling table in the shared memory. In this way, the plurality of processors in the terminal may separately perform corresponding fault detection based on tasks executed by the plurality of processors. The configuration area is provided for the scheduling table by reserving the shared memory. This avoids providing a configuration area of the scheduling table for each processor separately, and saves overheads of storage resources.

In some possible implementations, that the terminal executes the at least one test pattern based on the scheduling table may include: The terminal writes the at least one test pattern into a sorting register based on the execution sequence; and executes the test pattern based on the execution sequence in the sorting register, and writes an execution result of the test pattern into a status register. Sequential scheduling of test patterns in a scheduling table is implemented in a hardware manner, so that efficiency of scheduling the test patterns can be improved.

According to a second aspect, a terminal is provided. The terminal includes a processing unit and an obtaining unit. The obtaining unit is configured to obtain a scheduling table of a target task. The scheduling table is used to indicate at least one test pattern, the at least one test pattern is used to detect a fault in a target logic circuit, and the target logic circuit is a logic circuit configured to execute the target task. The processing unit is configured to execute the at least one test pattern based on the scheduling table, to detect the fault in the target logic circuit.

In some possible implementations, the target task is a running task.

In some possible implementations, the at least one test pattern in the scheduling table is determined based on a first mapping relationship and at least one instruction type, the first mapping relationship includes a mapping relationship between an instruction type and a test pattern, the at least one instruction type is determined based on a second mapping relationship and a machine instruction code set of the target task, the second mapping relationship includes a mapping relationship between a machine instruction code and an instruction type, and the machine instruction code set includes a plurality of machine instruction codes.

In some possible implementations, the scheduling table further indicates an execution sequence of the at least one test pattern, and the execution sequence is determined based on a quantity of execution times of the at least one instruction type corresponding to the machine instruction code set of the target task.

In some possible implementations, the terminal further includes an obtaining unit. The obtaining unit is configured to obtain a machine instruction code set of the target task. The machine instruction code set includes a plurality of machine instruction codes. The processing unit is further configured to: determine, based on a second mapping relationship, at least one instruction type corresponding to the machine instruction code set, where the second mapping relationship includes a mapping relationship between a machine instruction code and an instruction type; determine, based on a first mapping relationship, the at least one test pattern corresponding to the at least one instruction type, where the first mapping relationship includes a mapping relationship between an instruction type and a test pattern, and the at least one test pattern is used to detect a fault in a logic circuit corresponding to the at least one instruction type; and generate the scheduling table based on the at least one test pattern.

In some possible implementations, the processing unit is further configured to: determine a quantity of execution times of an instruction type in the at least one instruction type based on instruction types respectively corresponding to the plurality of machine instruction codes; determine an execution sequence of a test pattern in the at least one test pattern based on the quantity of execution times; and generate the scheduling table based on the at least one test pattern and the execution sequence.

In some possible implementations, the processing unit is further configured to: generate a third mapping relationship, where the third mapping relationship includes a mapping relationship between the target task and the scheduling table; and determine the scheduling table based on the target task and the third mapping relationship.

In some possible implementations, the scheduling table is stored in a shared memory, the shared memory is configured to store a scheduling table of one or more tasks, and the shared memory is accessible to a plurality of processors.

In some possible implementations, the processing unit is further configured to: write the at least one test pattern into a sorting register based on the execution sequence; and execute the test pattern based on the execution sequence in the sorting register, and write an execution result of the test pattern into a status register.

In some possible implementations, the target task includes a process or a thread.

According to a third aspect, a terminal is provided. The terminal includes a processor, and the processor reads computer-readable instructions in a memory, so that the terminal implements the method according to any one of the implementations of the first aspect.

According to a fourth aspect, a computer-readable storage medium is provided. The computer-readable storage medium stores a computer program, and when the computer program is run on a computer, the computer is enabled to perform the method according to any one of the implementations of the first aspect.

According to a fifth aspect, a computer program product is provided. When the computer program product is run on a computer, the computer is enabled to perform the method according to any one of the implementations of the first aspect.

According to a sixth aspect, a chip is provided, including one or more processors. Some or all of the processors are configured to read and execute a computer program stored in a memory, to perform the method according to any possible implementation of any one of the foregoing aspects. In some embodiments, the chip includes the memory, and the memory and the processor are connected to the memory by using a circuit or a wire. Furthermore, the chip further includes a communication interface, and the processor is connected to the communication interface. The communication interface is configured to receive data and/or information that needs to be processed. The processor obtains the data and/or information from the communication interface, processes the data and/or information, and outputs a processing result through the communication interface. The communication interface may be an input/output interface. The method may be implemented by one chip, or may be cooperatively implemented by a plurality of chips.

BRIEF DESCRIPTION OF THE DRAWINGS

FIG. 2 is a schematic flowchart of a fault detection method 200 according to an embodiment;

FIG. 3C is a schematic flowchart of another scheduling table generation according to an embodiment;

FIG. 4 is a schematic diagram of structures of a sorting register and a status register according to an embodiment;

DETAILED DESCRIPTION

Figure 1A:
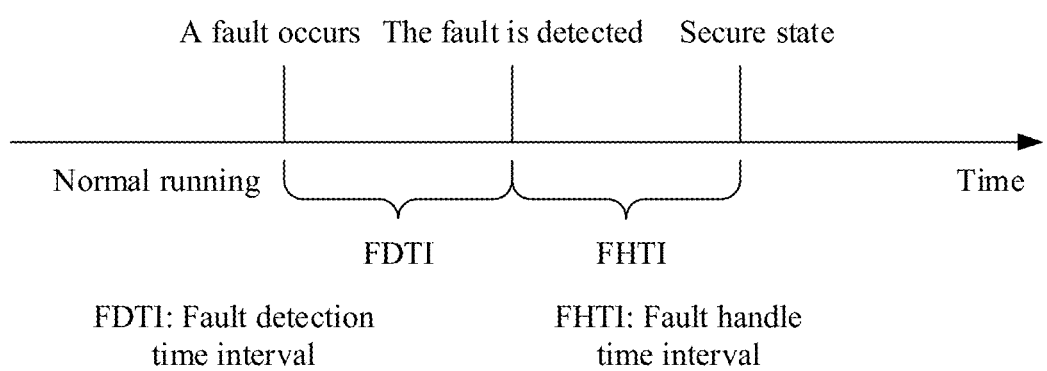
FIG. 1A is a schematic diagram of an FETI and an FHTI according to an embodiment.

The following describes embodiments with reference to the accompanying drawings. It is clear that the described embodiments are merely some rather than all of the embodiments. A person of ordinary skill in the art may learn that, with technology development and emergence of a new scenario, the technical solutions provided in embodiments are also applicable to a similar technical problem.

In the specification, claims, and accompanying drawings, the terms "first", "second", and the like are intended to distinguish between similar objects but do not necessarily indicate a specific order or sequence. It should be understood that data used in such a way are interchangeable in proper cases, so that embodiments described herein can be implemented in other orders than the order illustrated or described herein. In addition, the terms "include", "contain" and any other variants mean to cover the non-exclusive inclusion, for example, a process, method, system, product, or device that includes a list of steps or modules is not necessarily limited to those steps or modules, but may include other steps or modules not expressly listed or inherent to such a process, method, product, or device. Names or numbers of steps do not mean that the steps in the method procedure need to be performed in a time/logical sequence indicated by the names or numbers. An execution sequence of the steps in the procedure that have been named or numbered can be changed based on a technical objective to be achieved, provided that same or similar technical effects can be achieved.

In the computer field, a random hardware fault may occur in a data processing device, such as a permanent fault caused by a short circuit or an open circuit in an integrated circuit, or a temporary fault such as bit flipping caused by exposure to natural radiation or particle collision.

With wide application of the data processing apparatus in a large quantity of fields, to avoid a loss caused by the hardware fault that occurs in the data processing apparatus, a concept of "functional safety" is proposed. Functional safety means that there is no unacceptable risk caused by an electronic system fault. The ultimate goal of the functional safety is to prevent personal injury or a huge property loss caused by the electronic system fault.

In fields with high security requirements, such as fields of aerospace, transportation, and medical care, corresponding security mechanisms are provided to meet requirements of the functional safety. These security mechanisms need to ensure that a system reaches a secure state after a fault is detected, to prevent harm. For example, in the automotive field, a typical security risk is usually caused by a fault that occurs in an electronic control unit of an anti-lock system or a power steering system. When the fault occurs in the electronic control unit of the anti-lock system or the power steering system, a fatal collision may occur in a vehicle. To ensure that the system reaches the secure state and prevent security risks, faults that have occurred need to be detected and handled in a timely manner.

Simply speaking, when a fault occurs in the system, the security mechanism needs to detect the fault that has occurred in the system and handle the fault in a timely manner, to ensure that the system can reach the secure state before danger occurs. Usually, an interval from a time point at which a fault occurs to a time point at which the fault is detected is referred to as a fault detection time interval (FDTI), and an interval from the time point at which the fault is detected to a time point at which the system reaches the secure state is referred to as a fault handle time interval (FHTI). For example, FIG. 1A is a schematic diagram of an FDTI and an FHTI according to an embodiment. To avoid danger, the system needs to reach the secure state within a specific period of time after the fault occurs in the system. That is, a sum of the FDTI and the FHTI needs to be less than or equal to a time threshold. Therefore, to ensure that there is an enough FHTI for fault processing and ensure that the fault can be processed smoothly, it is important to shorten the FDTI as much as possible.

At present, a method for implementing fault detection in a related technology is dual-core lockstep (DCLS). An implementation method of the DCLS is as follows: Two processors run a same program, and input output results of the two processors into one comparison logic to compare whether the output results of the two processors are the same. If the output results of the two processors are the same, it may be determined that no fault occurs; or if the output results of the two processors are different, it may be determined that faults occur in the processors. Although this fault detection manner can effectively detect a fault, the two processors need to be used to run the same program, which has disadvantages of high costs and poor flexibility.

Therefore, another software-based fault detection method is provided in the related technology. In this fault detection method, a processor periodically executes test patterns in an STL to detect a fault of a logic circuit. Compared with the DCLS, this fault detection method has low costs and high flexibility. However, because a system usually has many logic circuits, in order to implement fault detection of all logic circuits, the STL usually includes many test patterns. Therefore, when the processor periodically executes the test patterns in the STL, load of the processor is heavy. In other words, the processor needs to spend more time in fault detection. This affects working efficiency of the processor.

In view of this, embodiments provide a fault detection method. The fault detection method may be applied to a terminal. In a process of performing fault detection, the terminal determines a scheduling table corresponding to a currently running task, to execute a test pattern included in the scheduling table. Because the scheduling table includes only the test pattern corresponding to a machine instruction code of the task, the terminal detects a fault based on the scheduling table, so that execution of all test patterns in a software test library can be avoided. This reduces load of a processor and effectively improves working efficiency of the processor.

The terminal in embodiments may be a data processing device in fields with security requirements. Currently, for example, the terminal is a vehicle-mount terminal in transportation, a control terminal in aerospace, a wireless terminal in industrial control, a wireless terminal in self driving, a wireless terminal in remote medical surgery, a wireless terminal in a smart grid, a wireless terminal in transportation safety, a wireless terminal in a smart city, or a wireless terminal in a smart home.

Figure 1B:
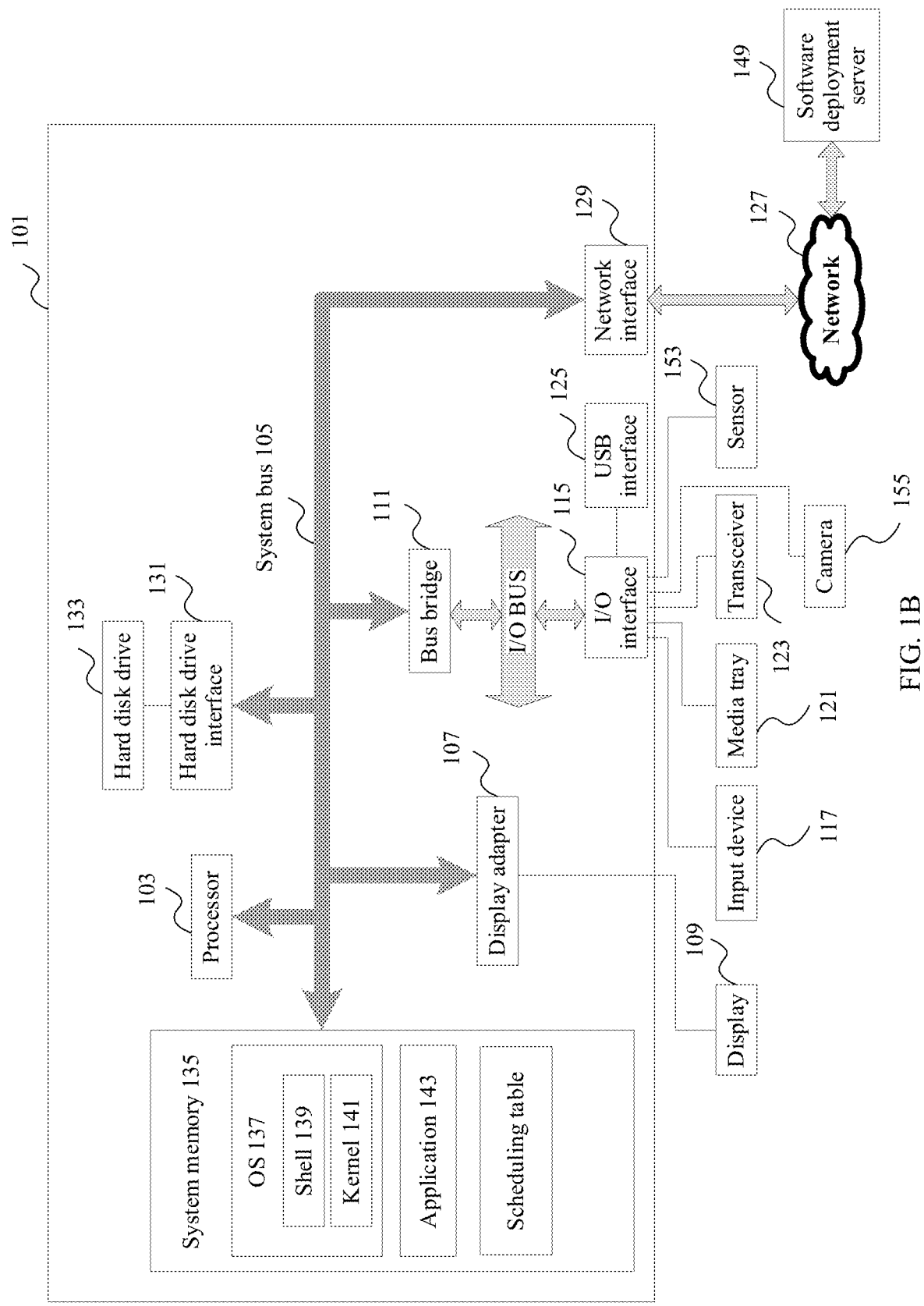
FIG. 1B is a schematic diagram of a structure of a terminal 101 according to an embodiment.

FIG. 1B is a schematic diagram of a structure of a terminal 101 according to an embodiment.

As shown in FIG. 1B, the terminal 101 includes a processor 103, and the processor 103 is coupled to a system bus 105. The processor 103 may be one or more processors, and each processor may include one or more processor cores. A display adapter (video adapter) 107 is further included, and the display adapter may drive a display 109, and the display 109 is coupled to the system bus 105. The system bus 105 is coupled to an input/output (I/O) bus through a bus bridge 111. An I/O interface 115 is coupled to the I/O bus. The I/O interface 115 communicates with a plurality of I/O devices, such as an input device 117 (for example, a touchscreen), a media tray 121 (for example, a compact disc read-only memory (CD-ROM) or a multimedia interface), a transceiver 123 (which may send and/or receive a radio communication signal), a camera 155 (which may capture static and dynamic digital video images), and an external USB interface 125. In some embodiments, an interface connected to the I/O interface 115 may be a USB interface.

The processor 103 may be any processor, including a reduced instruction set computing (RISC) processor, a complex instruction set computing (CISC) processor, or a combination thereof. In some embodiments, the processor may be a dedicated apparatus such as an ASIC.

The terminal 101 may communicate with a software deployment server 149 through a network interface 129. For example, the network interface 129 is a hardware network interface, for example, a network interface card. A network 127 may be an external network such as the Internet, or an internal network such as the Ethernet or a virtual private network (VPN). In some embodiments, the network 127 may alternatively be a wireless network, for example, a Wi-Fi network or a cellular network.

A hard disk drive interface 131 is coupled to the system bus 105. A hardware driver interface is connected to a hard disk drive 133. A system memory 135 is coupled to the system bus 105. Data running in the system memory 135 may include an operating system (OS) 137, an application 143, and a scheduling table of the terminal 101.

The operating system includes a shell 139 and a kernel 141. A shell 139 is an interface between a user and the kernel of the operating system. The shell is the outermost layer of the operating system. The shell manages interaction between the user and the operating system: waiting for an input from the user, interpreting the input from the user to the operating system, and processing various output results of the operating system.

The kernel 141 includes components of the operating system that are configured to manage a memory, a file, a peripheral, and a system resource. The kernel 141 directly interacts with hardware. The kernel of the operating system usually runs processes, provides inter-process communication, and provides CPU time slice management, interruption, memory management, I/O management, and the like.

For example, when the terminal 101 is a vehicle-mounted terminal, the application 143 includes a program related to vehicle driving control, for example, a program for managing interaction between a self-driving vehicle and an obstacle on a road, a program for controlling a route or a speed of a self-driving vehicle, or a program for controlling interaction between a self-driving vehicle and another self-driving vehicle on a road. In an embodiment, when the application 143 needs to be executed, the terminal 101 may download the application 143 from the software deployment server 149. In an embodiment, when the terminal 101 downloads the application 143 from the software deployment server 149, the terminal 101 may also download, from the software deployment server 149, a scheduling table corresponding to the application 143.

A sensor 153 is associated with the terminal 101. The sensor 153 is configured to detect an ambient environment of the terminal 101. For example, the sensor 153 may detect an animal, an automobile, an obstacle, a crosswalk, and the like. Further, the sensor 153 may also detect ambient environments of objects such as the animal, automobile, obstacle, and crosswalk, for example, an ambient environment of the animal, for example, another animal that appears around the animal, weather conditions, or brightness of an ambient environment. In some embodiments, if the terminal 101 is located in a self-driving vehicle, the sensor may be a radar system or the like.

The foregoing describes a scenario of the fault detection method provided in embodiments. The following describes in detail an execution process of the fault detection method.

FIG. 2 is a schematic flowchart of a fault detection method 200 according to an embodiment. As shown in FIG. 2, the fault detection method 200 includes the following steps.

Step 201: Obtain a scheduling table of a target task, where the scheduling table is used to indicate at least one test pattern, the at least one test pattern is used to detect a fault in a target logic circuit, and the target logic circuit is a logic circuit configured to execute the target task.

In this embodiment, in a normal running process of a terminal, the terminal may periodically perform the fault detection method 200, for example, perform the fault detection method 200 every 30 milliseconds or 50 milliseconds, to ensure that a fault that has occurred can be detected in a timely manner.

In a possible embodiment, the target task may be a running task in the terminal, for example, may be a running process or thread in the terminal. A manner in which the terminal determines the target task may be determining the target task by obtaining an identifier (ID) of a currently running task or based on a data structure corresponding to a currently running task. For example, based on a thread ID, a specific thread of the currently running task is determined. For example, when the target task is a process, the target task may be, for example, a process such as a vehicle video check process, a vehicle speed calculation process, a radar detection process, a vehicle anti-lock process, or a tire pressure detection process.

In this embodiment, any task that can be run in the terminal may have a corresponding scheduling table. For example, the scheduling table may be preset in the terminal, or may be generated by the terminal based on a task-based machine instruction code. Therefore, the terminal may determine, from a plurality of scheduling tables, the scheduling table corresponding to the target task. For example, when the target task is a process, the terminal may determine, based on a process ID, the scheduling table corresponding to the target task.

The scheduling table corresponding to the target task may include at least one test pattern, the at least one test pattern corresponds to a machine instruction code of the target task, and the at least one test pattern is used to detect a fault in the target logic circuit. That the at least one test pattern corresponds to a machine instruction code of the target task means that fault detection of the target logic circuit on which execution of the machine instruction code of the target task depends can be implemented based on the at least one test pattern.

Simply speaking, when executing the machine instruction code, the terminal needs to depend on a logic circuit in the terminal, that is, the terminal executes the machine instruction code based on the logic circuit. Therefore, when the at least one test pattern corresponding to the machine instruction code of the target task is determined, for the logic circuit used when the terminal executes the machine instruction code of the target task, fault detection may be implemented based on the at least one test pattern.

It may be understood that, in a process in which the terminal runs the target task, if a fault occurs in a logic circuit that needs to be used in a process of running the target task, a security risk may be generated due to the fault in the logic circuit when the terminal runs the target task. Therefore, a test pattern is executed based on the scheduling table corresponding to the target task, so that fault detection of a logic circuit that needs to be used can be implemented, and generation of a security risk can be avoided. For another logic circuit, because the terminal does not execute a corresponding task currently, that is, the another logic circuit does not need to be used, even if a fault occurs in this logic circuit, no security risk is generated.

In a possible embodiment, the at least one test pattern in the scheduling table is determined based on a first mapping relationship and at least one instruction type, the first mapping relationship includes a mapping relationship between an instruction type and a test pattern, the at least one instruction type is determined based on a second mapping relationship and a machine instruction code set of the target task, the second mapping relationship includes a mapping relationship between a machine instruction code and the instruction type, and the machine instruction code set includes a plurality of machine instruction codes.

In a possible embodiment, the scheduling table corresponding to the target task may further indicate an execution sequence of the at least one test pattern, and the execution sequence is determined based on a quantity of execution times of an instruction type corresponding to the machine instruction code of the target task.

One task usually includes a plurality of machine instruction codes, and different machine instruction codes may belong to different instruction types, or may belong to a same instruction type. Machine instruction codes of a same instruction type usually depend on a same logic circuit for execution, and machine instruction codes of different instruction types depend on different logic circuits for execution. In this case, when the target task includes a plurality of machine instruction codes of a same instruction type, in a process of executing the target task, the terminal needs to use a logic circuit corresponding to the instruction type for a plurality of times. To be specific, in a case in which a fault may occur in the logic circuit each time the logic circuit is used, and a probability of a fault occurring in the logic circuit is the same, a larger quantity of times of using the logic circuit indicates a higher probability of a fault occurring in the logic circuit. In other words, a larger quantity of execution times of a same instruction type indicates a larger quantity of times of using a logic circuit and a higher probability of a fault occurring in the logic circuit. Therefore, in this embodiment, an execution sequence of a test pattern in the scheduling table may be determined based on the quantity of execution times of the instruction type corresponding to the machine instruction code of the target task. In other words, a larger quantity of execution times of an instruction type indicates a higher execution sequence of a test pattern corresponding to the instruction type, so that the terminal can determine, based on a probability of a fault occurring in a logic circuit, a sequence of detecting the logic circuit. This shortens fault detection time and improves fault detection efficiency.

For example, it is assumed that the target task includes six machine instruction codes, and the six machine instruction codes respectively include three machine instruction codes belonging to an instruction type 1, two machine instruction codes belonging to an instruction type 0, and one machine instruction code belonging to an instruction type 2. In this case, a quantity of execution times of the instruction type 0, a quantity of execution times of the instruction type 1, and a quantity of execution times of the instruction type 2 are 2, 3, and 1 respectively. The scheduling table corresponding to the target task includes a test pattern A, a test pattern B, and a test pattern C that respectively correspond to the instruction type 0, the instruction type 1, and the instruction type 2. The scheduling table may further include an execution sequence of the foregoing three test patterns, and the execution sequence of the test patterns is determined based on quantities of the execution times of the instruction types corresponding to the test patterns. That is, the execution sequence of the test patterns is: test pattern B—>test pattern A—>test pattern C. In this way, in a process of performing fault detection, the terminal may sequentially perform the test pattern B, the test pattern A, and the test pattern C based on the execution sequence.

Step 202: Execute the at least one test pattern based on the scheduling table, to detect a fault in the target logic circuit.

After obtaining the scheduling table, the terminal sequentially executes one or more test patterns indicated by the scheduling table. In addition, after the test patterns indicated by the scheduling table are executed, the terminal may determine that a period of currently performing fault detection ends, and the terminal may perform the fault detection method 200 again after specific time. In addition, if the scheduling table further includes an execution sequence of the test patterns, the terminal may further sequentially execute the one or more test patterns in the scheduling table based on the execution sequence indicated by the scheduling table.

In this embodiment, in the process of performing fault detection, the terminal executes the test pattern included in the scheduling table by obtaining the scheduling table of the target task. Because the scheduling table includes only the test pattern used to detect the target logic circuit, the terminal detects a fault based on the scheduling table, so that execution of all test patterns in a software test library can be avoided. This reduces load of a processor and effectively improves working efficiency of the processor. In addition, when the scheduling table further includes an execution sequence of a test pattern that is determined based on a quantity of execution times of an instruction type, the terminal executes the test pattern based on the execution sequence, to determine a sequence of detecting a logic circuit based on a probability of a fault occurring in the logic circuit. This shortens the fault detection time and improves the fault detection efficiency.

The foregoing describes a process in which the terminal executes the corresponding test pattern based on the scheduling table corresponding to the target task to implement fault detection. The following describes in detail a process in which the terminal generates the scheduling table.

Figure 3A:
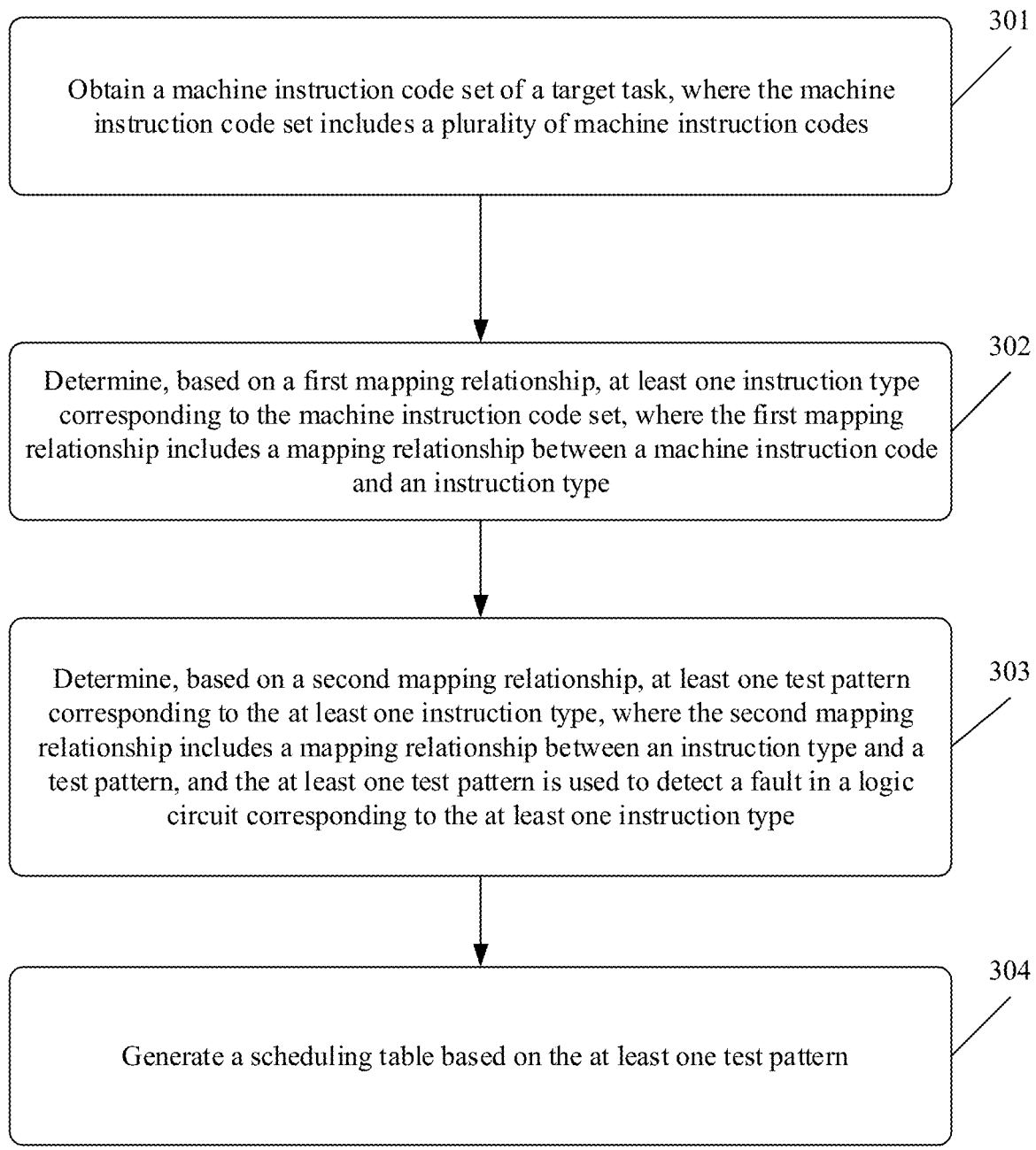
FIG. 3A is a schematic flowchart of a scheduling table generation method 300 according to an embodiment.

FIG. 3A is a schematic flowchart of a scheduling table generation method 300 according to an embodiment. As shown in FIG. 3A, the scheduling table generation method 300 includes the following steps.

Step 301: Obtain a machine instruction code set of a target task, where the machine instruction code set includes a plurality of machine instruction codes.

In this embodiment, before performing fault detection, a terminal may generate in advance a scheduling table corresponding to a to-be-run task in the terminal, so that the terminal can obtain, in a process of performing fault detection, the scheduling table corresponding to the target task.

It should be understood that, before the terminal performs fault detection, the target task is the to-be-run task in the terminal, and the terminal may obtain the machine instruction code set of the target task by obtaining an executable file of the target task. For example, when the target task is an application, the application is installed in the terminal. An executable file of the application may be, for example, a file such as a ".exe file", a ".sys file", or a ".com file". The terminal may obtain, based on the executable file of the application, a machine instruction code set corresponding to the application.

Generally, for the target task, the executable file of the target task usually includes a plurality of machine instruction codes. In other words, the machine instruction code set includes the plurality of machine instruction codes. The terminal executes the plurality of machine instruction codes to implement running of the target task.

Step 302: Determine, based on a second mapping relationship, at least one instruction type corresponding to the machine instruction code set, where the second mapping relationship includes a mapping relationship between a machine instruction code and an instruction type.

It may be understood that any machine instruction code has a corresponding instruction type, that is, any machine instruction code may be classified as a specific instruction type. The instruction type may include, for example, types such as a data transfer instruction type, a fixed-point arithmetic operation instruction type, a bitwise operation instruction type, and a program control instruction type. Because different machine instruction codes may correspond to a same instruction type, or may correspond to different instruction types, at least one instruction type may be determined based on each machine instruction code in the machine instruction code set.

The second mapping relationship may be preset in the terminal. The second mapping relationship includes the mapping relationship between a machine instruction code and an instruction type. The instruction type corresponding to each machine instruction code in the machine instruction code set may be determined based on the second mapping relationship. In some embodiments, a possible example of the second mapping relationship is shown in Table 1.

TABLE 1

| Machine instruction code 0 | Instruction type 0 |
|---|---|
| Machine instruction code 1, machine instruction code 2 | Instruction type 1 |
| ... | ... |
| Machine instruction code M | Instruction type N |

It can be learned from Table 1 that any machine instruction code corresponds to a unique instruction type, and one instruction type may correspond to one or more machine instruction codes. In this way, a quantity of instruction types determined by the terminal based on the machine instruction code set is equal to or less than a quantity of machine instruction codes in the machine instruction code set. When the quantity of instruction types is less than the quantity of machine instruction codes, it indicates that a plurality of machine instruction codes corresponds to a same instruction type. In other words, a quantity of execution times of the instruction type is the quantity of machine instruction codes corresponding to the instruction type.

In some embodiments, the second mapping relationship may be established based on an instruction set manual corresponding to a processor in the terminal. Generally, in the computer field, a command that instructs computer hardware to perform an operation or a processing function is referred to as an instruction, and a representation manner of the instruction may be the foregoing machine instruction code. The instruction is a minimum functional unit of a computer, and hardware is configured to implement a function specified by each instruction. A set of all instructions in the terminal is an instruction set of the terminal, and represents all functions of the terminal. Usually, an instruction set in a terminal reflects all functions of the terminal. Different types of terminals may have different instruction sets, and therefore functions are also different. Settings of the instruction set are closely related to a hardware circuit of the terminal, and the instruction set manual may indicate an instruction set that can be executed by the terminal and a relationship between the instruction set and the hardware circuit of the terminal. Based on the instruction set manual, the relationship between the instruction and the hardware circuit may be determined, and an instruction type to which each instruction in the instruction set belongs may also be determined, to establish the mapping relationship between a machine instruction code and an instruction type.

Step 303: Determine, based on a first mapping relationship, at least one test pattern corresponding to the at least one instruction type, where the first mapping relationship includes a mapping relationship between an instruction type and a test pattern, and the at least one test pattern is used to detect a fault in a logic circuit corresponding to the at least one instruction type.

Each type of instruction may be executed in a specific logic circuit, and a logic circuit corresponding to each type of instruction is fixed. Therefore, it may be considered that after an instruction type corresponding to a machine instruction code is determined, a logic circuit configured to execute the machine instruction code may be uniquely determined. In this case, after the at least one instruction type corresponding to the machine instruction code set is determined, the test pattern corresponding to the at least one instruction type is determined, so that detection of a logic circuit used by the target task may be implemented based on the determined test pattern.

The first mapping relationship may be preset in the terminal. The first mapping relationship includes the mapping relationship between an instruction type and a test pattern. Based on the first mapping relationship, a test pattern corresponding to each instruction type may be determined. In some embodiments, a possible example of the first mapping relationship is shown in Table 2.

TABLE 2

| Instruction type 0 | Test pattern group 0 |
|---|---|
| Instruction type 1 | Test pattern group 1 |
| ... | ... |
| Instruction type N | Test pattern group N |

It can be learned from Table 2 that any instruction type has a corresponding test pattern group, and each test pattern group may include one or more test patterns, that is, any instruction type has one or more corresponding test patterns. In addition, each test pattern is used to detect a specific logic circuit. Therefore, after determining an instruction type to which a machine instruction code belongs, the terminal may determine, based on the instruction type, a test pattern that needs to be executed.

In some embodiments, the first mapping relationship may be obtained based on a design document of an STL. For example, based on the design document of the STL, related information of all test patterns included in the STL may be determined. For example, a logic circuit detected in a test pattern is determined. In this way, when the logic circuit detected in the test pattern and the logic circuit that needs to be used by the instruction type are determined, the first mapping relationship may be established, to establish a mapping relationship between an instruction type and a test pattern that correspond to a same logic circuit.

Step 304: Generate a scheduling table based on the at least one test pattern.

In a possible embodiment, the terminal may generate the scheduling table only based on the determined at least one test pattern, that is, the obtained scheduling table includes only the at least one test pattern, but does not specify an execution sequence of the test pattern.

In another possible embodiment, the terminal may further determine an execution sequence of the at least one test pattern, and generate the scheduling table based on the execution sequence, so that the scheduling table may further include the execution sequence of the test pattern.

For example, after determining, based on the second mapping relationship, instruction types corresponding to the plurality of machine instruction codes, the terminal may determine a quantity of execution times of each instruction type in the at least one instruction type based on the instruction types respectively corresponding to the plurality of machine instruction codes. Simply speaking, the terminal may count a quantity of machine instruction codes corresponding to each instruction type, and determine the quantity of machine instruction codes corresponding to the instruction type as the quantity of execution times of the instruction type. The terminal may determine, based on the quantity of execution times, an execution sequence of a test pattern in the at least one test pattern. Because each test pattern has a unique corresponding instruction type, and each instruction type has a corresponding quantity of execution times, the terminal may determine an execution sequence of a test pattern based on a quantity of execution times of an instruction type corresponding to the test pattern. To be specific, the terminal may sort test patterns in descending order based on a quantity of execution times. A larger quantity of execution times of an instruction type corresponding to a test pattern indicates a higher execution sequence of the test pattern. On the contrary, a smaller quantity of execution times of an instruction type corresponding to a test pattern indicates a lower execution sequence of the test pattern. Finally, the terminal may generate, based on the at least one test pattern and the execution sequence, the scheduling table that includes the execution sequence of the test pattern, so that when performing fault detection, the terminal can sequentially execute the test pattern based on the execution sequence indicated in the scheduling table.

A process in which the terminal generates the corresponding scheduling table based on the target task is described in the foregoing steps 301 to 304. During actual application, after obtaining a plurality of to-be-run tasks, the terminal may separately determine, based on a similar procedure, scheduling tables corresponding to the plurality of tasks, so that the terminal may store the scheduling table corresponding to each task. In this way, when executing any task, the terminal may find a scheduling table corresponding to the task, to implement fault detection corresponding to the task.

It may be understood that when there is a large quantity of to-be-run tasks in the terminal, the terminal may generate a large quantity of scheduling tables. Therefore, to enable the terminal to quickly determine the scheduling table corresponding to the target task in the process of performing fault detection, after the terminal generates the scheduling table corresponding to each task, the terminal may further establish a mapping relationship between a task and a scheduling table. For example, the terminal may generate a third mapping relationship, and the third mapping relationship includes a mapping relationship between a to-be-run task and a scheduling table. After the terminal newly generates any scheduling table, the terminal may update the third mapping relationship, to add a mapping relationship between the newly generated scheduling table and a task, so that the third mapping relationship generated by the terminal can include a mapping relationship between each to-be-run task in the terminal and a scheduling table corresponding to the to-be-run task.

In a possible embodiment, after generating the scheduling table, the terminal may allocate a unique ID to each newly generated scheduling table, and establish a mapping relationship between a task ID and a scheduling table ID, to obtain the third mapping relationship. In this way, the terminal may quickly determine a corresponding scheduling table ID based on a task ID and the third mapping relationship, and obtain a corresponding scheduling table through searching based on the scheduling table ID. In some embodiments, a possible example of the third mapping relationship is shown in Table 3.

TABLE 3

| Task 0 | Scheduling table 0 |
|---|---|
| Task 1 | Scheduling table 1 |
| ... | ... |
| Task N | Scheduling table N |

In addition, the terminal may alternatively allocate corresponding address space to a newly generated scheduling table after generating the scheduling table, to obtain the address space for storing the scheduling table. In this way, the terminal may establish a mapping relationship between a task ID and address space of a scheduling table, to obtain the third mapping relationship. In other words, the terminal may quickly determine, based on the task ID and the third mapping relationship, the address space of the scheduling table corresponding to the task ID, to find the corresponding scheduling table in the address space.

Figure 3B:
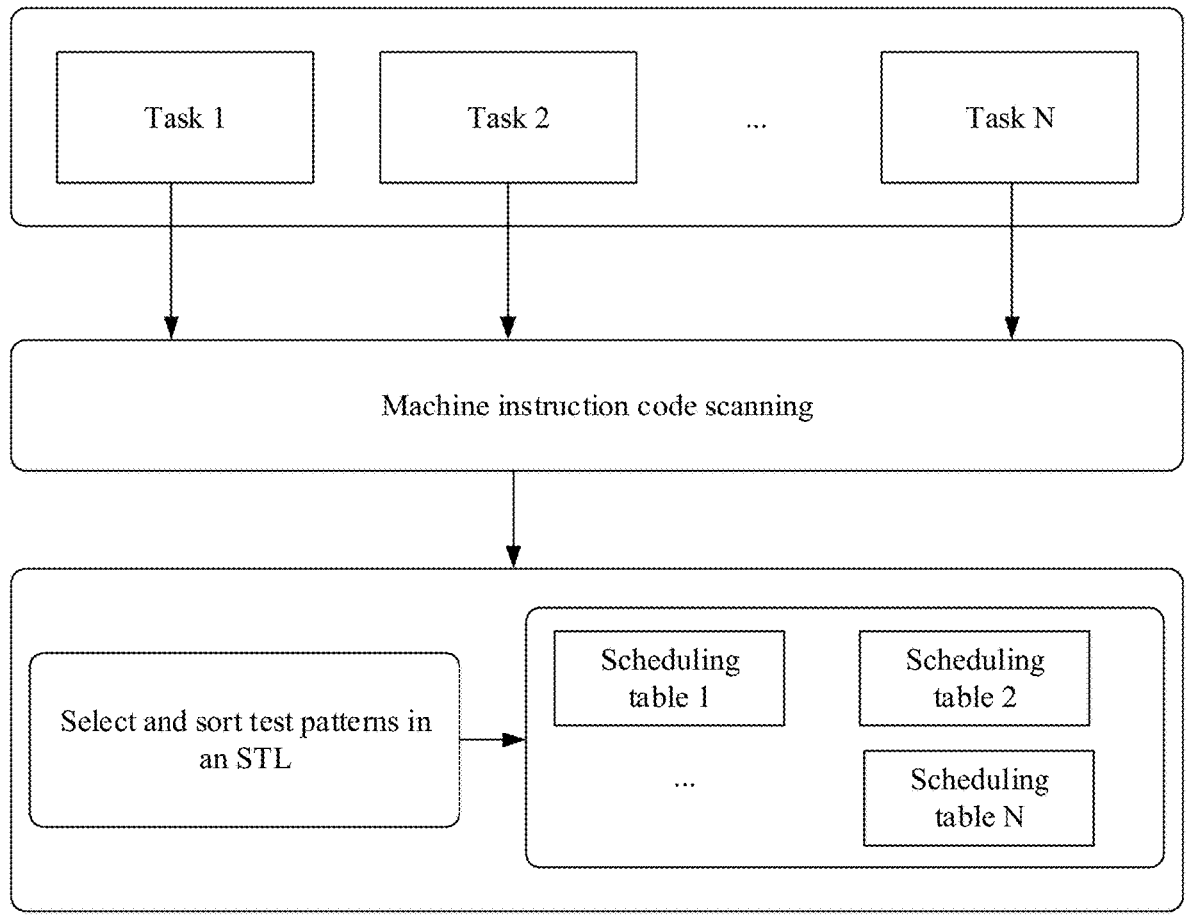
FIG. 3B is a schematic flowchart of another scheduling table generation according to an embodiment.

FIG. 3B is a schematic flowchart of another scheduling table generation according to an embodiment. As shown in FIG. 3B, a terminal may obtain N tasks such as a task 1, a task 2, . . . , and a task N that are located in the terminal; and then the terminal separately performs machine instruction code scanning on these tasks, to determine a machine instruction code corresponding to each task. Based on the machine instruction code of each task, the terminal may select, in an STL, a test pattern corresponding to the machine instruction code of each task, and sort these selected test patterns, to obtain a scheduling table of each task, namely, a scheduling table 1 of the task 1, a scheduling table 2 of the task 2, . . . , and a scheduling table N of the task N.

FIG. 3C is a schematic flowchart of another scheduling table generation according to an embodiment. As shown in FIG. 3C, a scheduling table generation process is described by using an example in which a processing chip is a Hi1951 Taishan in FIG. 3C. The Hi1951 Taishan is a processing chip of Huawei. The processing chip may include a plurality of processors, and can execute different tasks in parallel. As shown in FIG. 3C, first, a mapping relationship between a machine instruction code and an instruction type may be determined based on a processor architecture instruction set of the Hi1951 Taishan, to obtain a mapping table A; and a mapping relationship between an instruction type and a test pattern is determined based on a test pattern design solution of the Hi1951 Taishan, to obtain a mapping table B. Then, based on the mapping table A and an executable file of a target task, an instruction scanner may determine to obtain an instruction type corresponding to each machine instruction code in the executable file, to obtain all instruction types corresponding to the executable file. After all the instruction types corresponding to the executable file are obtained, test patterns corresponding to the instruction types may be determined based on the mapping table B, and the test patterns are sorted based on quantities of execution times of the instruction types. That is, test patterns are selected and sorted in an STL to obtain a scheduling table corresponding to the target task.

The foregoing describes a process in which the terminal generates a scheduling table based on a machine instruction code set of a task. The following describes in detail a process in which the terminal configures the scheduling table after the scheduling table is generated.

In a possible embodiment, the terminal may provide a configuration area for the scheduling table by reserving a shared memory.

For example, the terminal may reserve some memory space as the shared memory by using a device tree binary (DTB) configuration, to obtain a reference handle of the shared memory, where the reference handle includes configuration information such as an address, a size, and an access permission of the shared memory. After the terminal generates the scheduling table, the terminal may allocate address space in the shared memory to the scheduling table, and store the scheduling table in the address space in the shared memory. In addition, the terminal may further generate configuration information of the scheduling table based on the address space, for example, generate a mapping relationship between an index of the address space and a scheduling table ID, so that when performing fault detection, the terminal can determine the index of the address space based on the scheduling table ID, to find the scheduling table in the address space.

When the terminal provides the configuration area for the scheduling table by reserving the shared memory, a plurality of processors in the terminal may all access the scheduling table in the shared memory. In this way, the plurality of processors in the terminal may separately perform corresponding fault detection based on tasks executed by the plurality of processors. The configuration area is provided for the scheduling table by reserving the shared memory. This avoids providing a configuration area of the scheduling table for each processor separately, and saves overheads of storage resources.

In another possible embodiment, the terminal may implement scheduling of a scheduling table in a hardware manner.

For example, in the processor of the terminal, two registers that are used to schedule a scheduling table and that are respectively a sorting register and a status register may be designed in advance. In a process in which the terminal performs fault detection, after the terminal determines the scheduling table corresponding to the target task, the terminal may sequentially write the test patterns in the scheduling table into the sorting register based on the execution sequence of the test patterns in the scheduling table. Then, the terminal may execute the test patterns according to the execution sequence in the sorting register, and write execution results of the test patterns into the status register.

For example, FIG. 4 is a schematic diagram of structures of a sorting register and a status register according to an embodiment. As shown in FIG. 4, both the sorting register and the status register are 64-bit registers. In the sorting register, 64 bits are divided into 16 groups, and each group includes four bits. Every four bits may indicate an ID of a test pattern group. The terminal may sequentially write the test patterns in the scheduling table into the sorting register abased on the execution sequence of the test patterns in the scheduling table, and when performing fault detection, sequentially execute the test patterns based on the execution sequence in the sorting register.

In the status register, the 64 bits of the status register are divided into a plurality of parts. Bit [2:0] indicates a test status. A value 0 indicates that a test is not started. A value 1 indicates that the test is completed. A value 2 indicates that the test is in progress. Bit [4:3] indicates a test result. A value 0 indicates that the test is passed. A value 1 indicates that the test fails. Bit [30:5] indicates a reserved bit used to reserve a specific quantity of bits for future expansion. Bit [47:31] indicates a test pattern ID, indicating an ID of a current executed test pattern. Bit [54:48] indicates a hardware module detected in a current test pattern, for example, may indicate a logic circuit.

The foregoing describes the process in which the terminal performs fault detection. For ease of understanding, the following describes in detail beneficial effects brought by the terminal by performing the foregoing fault detection method with reference to an example.

It is assumed that an STL in the terminal includes 20 test patterns: a test pattern 1 to a test pattern 20. The terminal further includes two to-be-run tasks: a task A and a task B, and determines, based on the fault detection method provided in embodiments, that test patterns corresponding to the task A are the test pattern 1 to the test pattern 12, and test patterns corresponding to the task B are the test pattern 10 to the test 20.

Figure 5:
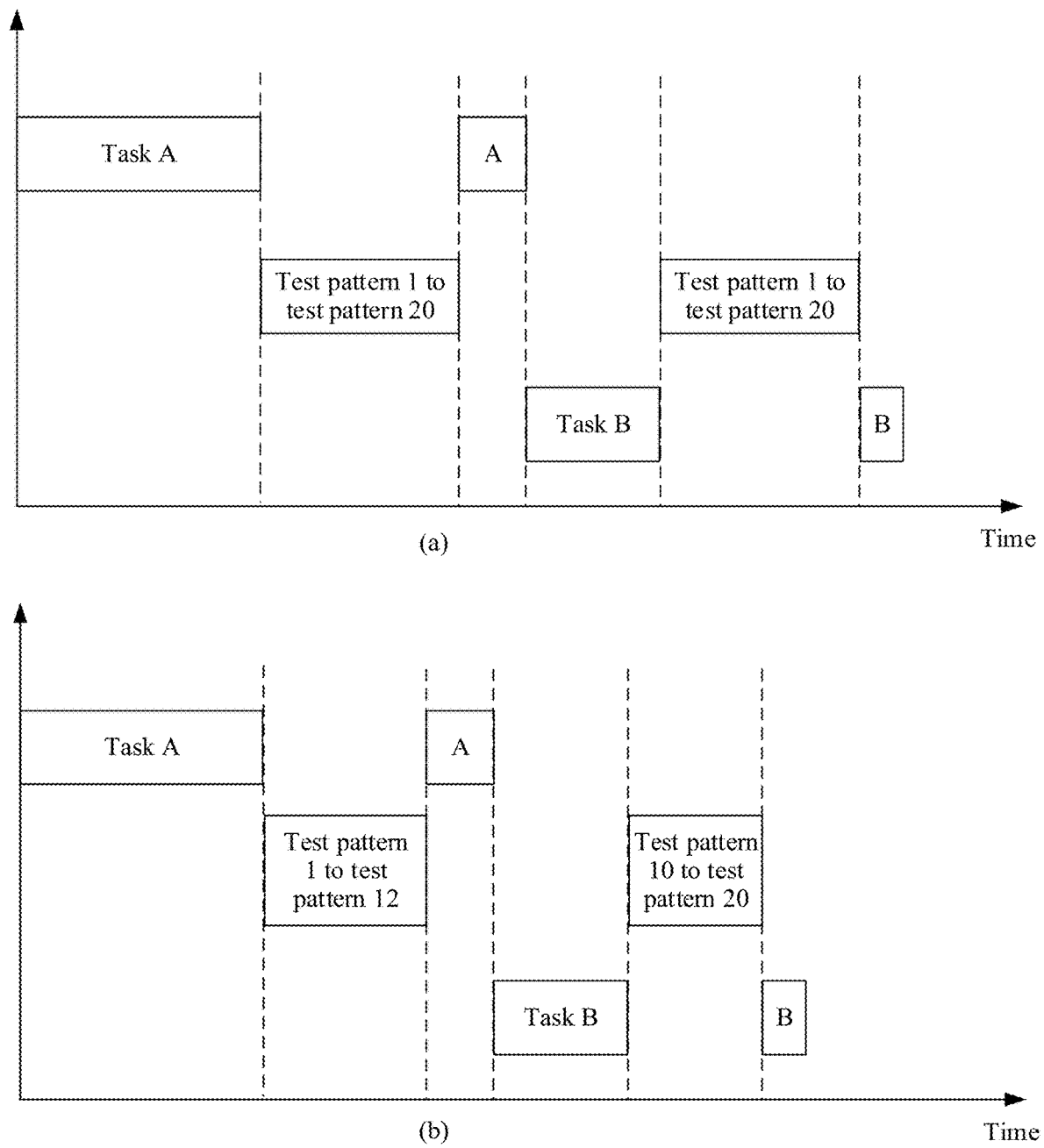
FIG. 5 is a schematic diagram showing comparison when fault detection is performed according to an embodiment.

FIG. 5 is a schematic diagram showing comparison when fault detection is performed according to an embodiment. As shown in (a) in FIG. 5, a process of performing fault detection in a related technology is as follows: In a process in which the terminal runs normally, the terminal first executes the task A, and then executes the task B. After a specific time interval after the terminal starts to execute the task A, the terminal starts to execute the 20 test patterns included in the STL, namely, the test pattern 1 to the test pattern 20. After the 20 test patterns are executed, the terminal continues to execute the task A until the task A is executed completely, and continues to execute the task B. In a process in which the terminal executes the task B, the terminal continues to execute the 20 test patterns after a specific time interval after the test pattern is executed last time. That is, regardless of what task is currently being executed by the terminal, the terminal needs to periodically execute 20 test patterns. In this way, execution of the test patterns needs to occupy excessively long time of the processor.

As shown in (b) in FIG. 5, a process of performing fault detection in this solution is as follows: In a process in which the terminal runs normally, similarly, the terminal first executes the task A, and then executes the task B. After a specific time interval after the terminal starts to execute the task A, the terminal starts to execute the 12 test patterns corresponding to the task A, namely, the test pattern 1 to the test pattern 12. After the 12 test patterns are executed, the terminal continues to execute the task A until the task A is executed completely, and continues to execute the task B. In a process in which the terminal executes the task B, after a specific time interval after the test pattern is executed last time, the terminal executes the 10 test patterns corresponding to the task B, namely, the test pattern 10 to the test 20. That is, the terminal may select, based on a task that is currently being executed, a test pattern that needs to be executed, instead of executing all test patterns in the STL. This shortens time for the terminal to execute a test pattern each time.

Figure 6:
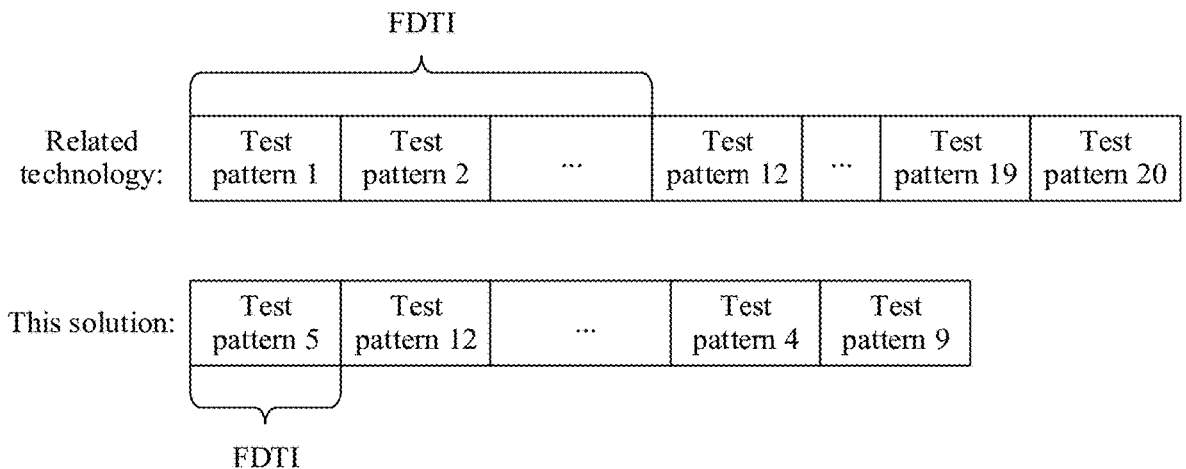
FIG. 6 is a schematic diagram showing comparison between FDTIs in different solutions according to an embodiment.

In addition, it is assumed that a fault occurs in a process in which the terminal executes the task A, a logic circuit in which the fault occurs is a logic circuit used by the terminal for a large quantity of times when the terminal executes the task A, and a test pattern used to detect the logic circuit is the test pattern 12. In this case, in the related technology, the terminal sequentially executes the test patterns based on a sequence of the test pattern 1 to the test pattern 20. The logic circuit in which the fault occurs can be detected only after the 12 test patterns (namely, the test pattern 1 to the test pattern 20) are executed in total. In this way, fault detection time is long. However, in this solution, because the logic circuit corresponding to the test pattern 12 is the logic circuit used for a large quantity of times when the terminal executes the task A, an execution sequence of the test pattern 12 is high, and the terminal can quickly detect, based on an adjusted execution sequence, the logic circuit in which the fault occurs. For details, FIG. 6 is a schematic diagram showing comparison between FDTIs in different solutions according to an embodiment. It can be learned from FIG. 6 that, compared with that in the related technology, in this solution, a test pattern is executed based on an adjusted execution sequence, so that fault detection time can be effectively shortened.

Figure 7A:
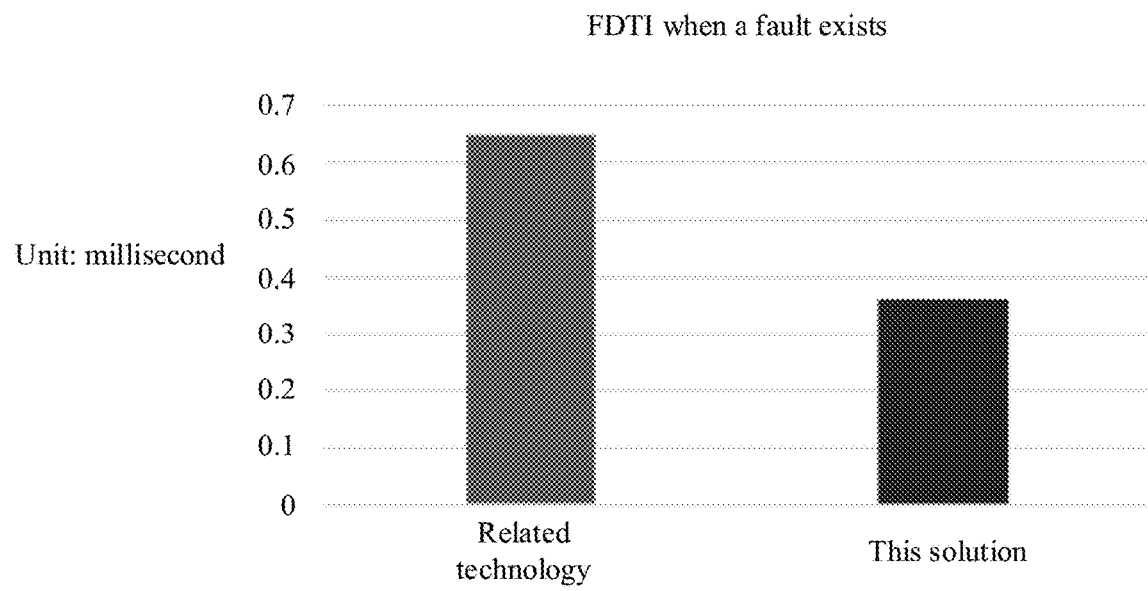
FIG. 7A is a schematic diagram showing comparison between FDTIs in different solutions when a fault exists according to an embodiment.
Figure 7B:
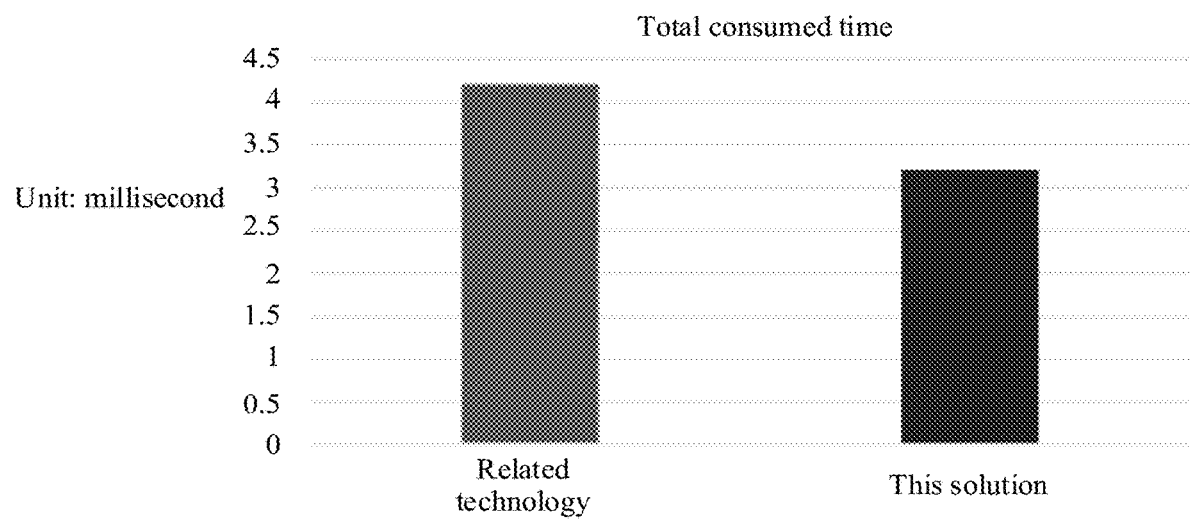
FIG. 7B is a schematic diagram showing comparison between total consumed times of fault detection in different solutions according to an embodiment.

In addition, this embodiment further provides a comparison between FDTIs when fault detection is performed by using the related technology and this solution in a case in which a fault exists in a logic circuit, and a comparison between total time consumed when fault detection is performed by using the related technology and this solution in a case in which no fault exists in a logic circuit. FIG. 7A is a schematic diagram showing comparison between FDTIs in different solutions when a fault exists according to an embodiment. It can be learned from FIG. 7A that, in a case in which a fault exists in a logic circuit, it takes approximately 0.7 milliseconds (ms) to detect the fault by using the related technology, and it takes less than 0.4 ms to detect the fault by using this solution. This effectively shortens fault detection time. FIG. 7B is a schematic diagram showing comparison between total consumed times of fault detection in different solutions according to an embodiment. It can be learned from FIG. 7B that, in a case in which no fault exists in a logic circuit, a total consumed time of fault detection by using the related technology is close to 4.5 ms, and a total consumed time of fault detection by using this solution is less than 3.5 ms. This can effectively shorten fault detection time, and reduce load of a processor.

Figure 8:
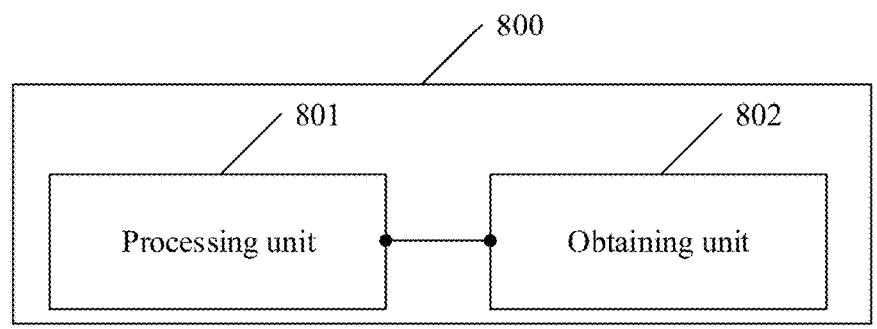
FIG. 8 is a schematic diagram of a structure of a terminal 800 according to an embodiment.

Based on the embodiments corresponding to FIG. 1A to FIG. 7B, to better implement the foregoing solutions in embodiments, the following further provides related devices configured to implement the foregoing solutions. For details, FIG. 8 is a schematic diagram of a structure of a terminal 800 according to an embodiment. The terminal 800 includes a processing unit 801 and an obtaining unit 802. The obtaining unit 802 is configured to obtain a scheduling table of a target task. The scheduling table is used to indicate at least one test pattern, the at least one test pattern is used to detect a fault in a target logic circuit, and the target logic circuit is a logic circuit configured to execute the target task. The processing unit 801 is configured to execute the at least one test pattern based on the scheduling table, to detect the fault in the target logic circuit.

In some possible implementations, the target task is a running task.

In some possible implementations, the at least one test pattern in the scheduling table is determined based on a first mapping relationship and at least one instruction type, the first mapping relationship includes a mapping relationship between an instruction type and a test pattern, the at least one instruction type is determined based on a second mapping relationship and a machine instruction code set of the target task, the second mapping relationship includes a mapping relationship between a machine instruction code and an instruction type, and the machine instruction code set includes a plurality of machine instruction codes.

In some possible implementations, the scheduling table further indicates an execution sequence of the at least one test pattern, and the execution sequence is determined based on a quantity of execution times of the at least one instruction type corresponding to the machine instruction code set of the target task. In some possible implementations, the terminal further includes an obtaining unit 802. The obtaining unit 802 is configured to obtain a machine instruction code set of the target task. The machine instruction code set includes a plurality of machine instruction codes. The processing unit 801 is further configured to: determine, based on a second mapping relationship, at least one instruction type corresponding to the machine instruction code set, where the second mapping relationship includes a mapping relationship between a machine instruction code and an instruction type; determine, based on a first mapping relationship, the at least one test pattern corresponding to the at least one instruction type, where the first mapping relationship includes a mapping relationship between an instruction type and a test pattern, and the at least one test pattern is used to detect a fault in a logic circuit corresponding to the at least one instruction type; and generate the scheduling table based on the at least one test pattern.

In some possible implementations, the processing unit 801 is further configured to: determine a quantity of execution times of an instruction type in the at least one instruction type based on instruction types respectively corresponding to the plurality of machine instruction codes; determine an execution sequence of a test pattern in the at least one test pattern based on the quantity of execution times; and generate the scheduling table based on the at least one test pattern and the execution sequence.

In some possible implementations, the processing unit 801 is further configured to: generate a third mapping relationship, where the third mapping relationship includes a mapping relationship between the target task and the scheduling table; and determine the scheduling table based on the target task and the third mapping relationship.

In some possible implementations, the scheduling table is stored in a shared memory, the shared memory is configured to store a scheduling table of one or more tasks, and the shared memory is accessible to a plurality of processors.

In some possible implementations, the processing unit 801 is further configured to: write the at least one test pattern into a sorting register based on the execution sequence; and execute the test pattern based on the execution sequence in the sorting register, and write an execution result of the test pattern into a status register.

In some possible implementations, the target task includes a process or a thread.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided, it should be understood that the disclosed system, apparatus, and method may be implemented in other manners. For example, the described apparatus embodiment is merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in an electrical form, a mechanical form, or another form.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in embodiments may be integrated into one processing unit, each of the units may exist alone physically, or two or more units are integrated into one unit. The integrated unit may be implemented in a form of hardware, or may be implemented in a form of a software functional unit.

When the integrated unit is implemented in a form of a software functional unit and is sold or used as an independent product, the integrated unit may be stored in a computer-readable storage medium. Based on such an understanding, the technical solutions of this disclosure may be implemented in a form of a software product. The computer software product is stored in a storage medium and includes several instructions for instructing a computer device (which may be a personal computer, a server, a network device, or the like) to perform all or some of the steps of the methods in embodiments. The foregoing storage medium includes any medium that can store program code, such as a Universal Serial Bus (USB) flash drive, a removable hard disk, a read-only memory (ROM), a random-access memory (RAM), a magnetic disk, or an optical disc.

What is claimed is:

1. A fault detection method comprising:
   obtaining a scheduling table of a target task, wherein the scheduling table indicates test patterns and an execution sequence of a first test pattern, wherein the test patterns comprise the first test pattern, wherein the first test pattern is for detecting a fault in a target logic circuit, wherein the target logic circuit is for executing the target task, and wherein the execution sequence is based on a quantity of execution times of an instruction type; and
   executing the first test pattern based on the scheduling table to detect the fault.

2. The fault detection method of claim 1, wherein the target task is a running task.

3. The fault detection method of claim 1, further comprising:
   determining the instruction type based on a second mapping relationship and a machine instruction code set of the target task, wherein the second mapping relationship maps the instruction type to the machine instruction code; and
   determining the first test pattern based on a first mapping relationship and the instruction type, wherein the first mapping relationship maps the first test pattern to the instruction type.

4. The fault detection method of claim 3, further comprising generating the scheduling table based on the first test pattern.

5. The fault detection method of claim 4, further comprising:
   determining the quantity; and
   determining the execution sequence of the first test pattern based on the quantity; and
   further generating the scheduling table based on the first test pattern and the execution sequence.

6. The fault detection method of claim 3, further comprising:
   writing the first test pattern into a sorting register based on the execution sequence;
   further executing the first test pattern based on the execution sequence to obtain an execution result; and
   writing the execution result into a status register.

7. The fault detection method of claim 1, further comprising storing the scheduling table in a shared memory that is accessible to a plurality of processors.

8. The fault detection method of claim 1, wherein the target task comprises a process or a thread.

9. A terminal comprising:
   a memory configured to store instructions; and
   one or more processors coupled to the memory and configured to execute the instructions to cause the terminal to:
      obtain a scheduling table of a target task, wherein the scheduling table indicates test patterns and an execution sequence of a first test pattern, wherein the test patterns comprise the first test pattern, wherein the first test pattern is for detecting a fault in a target logic circuit, wherein the target logic circuit is for executing the target task, and wherein the execution sequence is based on a quantity of execution times of an instruction type; and
      execute the first test pattern based on the scheduling table to detect the fault.

10. The terminal of claim 9, wherein the target task is a running task.

11. The terminal of claim 9, wherein the one or more processors are further configured to execute the instructions to cause the terminal to:
   determine the instruction type based on a second mapping relationship and a machine instruction code set of the target task, wherein the second mapping relationship maps the instruction type to the machine instruction code; and
   determine the first test pattern based on a first mapping relationship and the instruction type, wherein the first mapping relationship maps the first test pattern to the instruction type.

12. The terminal of claim 11, wherein the one or more processors are further configured to execute the instructions to cause the terminal to generate the scheduling table based on the first test pattern.

13. The terminal of claim 12, wherein the one or more processors are further configured to execute the instructions to cause the terminal to:
   determine the quantity;
   determine the execution sequence of the first test pattern based on the quantity; and
   further generate the scheduling table based on the first test pattern and the execution sequence.

14. The terminal of claim 11, wherein the one or more processors are further configured to execute the instructions to cause the terminal to:
   write the first test pattern into a sorting register based on the execution sequence;
   further execute the first test pattern based on the execution sequence to obtain an execution result; and
   write the execution result into a status register.

15. The terminal of claim 9, wherein the one or more processors are further configured to execute the instructions to cause the terminal to store the scheduling table in a shared memory that is accessible to a plurality of processors.

16. The terminal of claim 9, wherein the target task comprises a process or a thread.

17. A computer program product comprising computer-executable instructions stored on a non-transitory computer-readable storage medium that, when executed by one or more processors, cause a terminal to:
   obtain a scheduling table of a target task, wherein the scheduling table indicates test patterns and an execution sequence of a first test pattern, wherein the test patterns comprise the first test pattern, wherein the first test pattern is for detecting a fault in a target logic circuit, wherein the target logic circuit is for executing the target task, and wherein the execution sequence is based on a quantity of execution times of an instruction type; and execute the first test pattern based on the scheduling table to detect the fault.

18. The computer program product of claim 17, wherein the target task is a running task.

19. The computer program product of claim 17, wherein the computer-executable instructions, when executed by the one or more processors, further cause the terminal to:

determine the instruction type based on a second mapping relationship and a machine instruction code set of the target task, wherein the second mapping relationship maps the instruction type to the machine instruction code; and determine the first test pattern based on a first mapping relationship and the instruction type, wherein the first mapping relationship maps the first test pattern to the instruction type.

20. The computer program product of claim 19, wherein the computer-executable instructions, when executed by the one or more processors, further cause the terminal to generate the scheduling table based on the first test pattern.

\* \* \* \* \*